US006239039B1

United States Patent
Nihonmatsu et al.

(10) Patent No.: US 6,239,039 B1
(45) Date of Patent: May 29, 2001

(54) SEMICONDUCTOR WAFERS PROCESSING METHOD AND SEMICONDUCTOR WAFERS PRODUCED BY THE SAME

(75) Inventors: Takashi Nihonmatsu; Seiichi Miyazaki; Masahiko Yoshida, all of Nagano-ken; Hideo Kudo, Tokyo; Tadahiro Kato, Fukushima-ken, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/207,193

(22) Filed: Dec. 8, 1998

(30) Foreign Application Priority Data

Dec. 9, 1997 (JP) .................................................. 9-356153
Apr. 15, 1998 (JP) ................................................ 10-122858
Aug. 11, 1998 (JP) ................................................ 10-241101

(51) Int. Cl.$^7$ ......................... H01L 21/302; H01L 21/461
(52) U.S. Cl. .......................... 438/749; 438/689; 438/745; 438/750; 438/753; 438/928; 438/974; 216/99
(58) Field of Search .................................... 438/689, 745, 438/749, 750, 753, 928, 974; 216/99

(56) References Cited

U.S. PATENT DOCUMENTS 5,899,731 * 5/1999 Kai et al. .............................. 438/471
5,976,983 * 11/1999 Miyazaki et al. ..................... 438/692

FOREIGN PATENT DOCUMENTS 9266194    10/1997  (JP) .

* cited by examiner

Primary Examiner—John F. Niebling
Assistant Examiner—David A Zarneke
(74) Attorney, Agent, or Firm—Hogan & Hartson, LLP

(57) ABSTRACT

A method of processing a semiconductor wafer sliced from a monocrystalline ingot comprises at least the steps of chamfering, lapping, etching, mirror-polishing, and cleaning. In the etching step, alkali etching is first performed and then acid etching, preferably reaction-controlled acid etching, is performed. The etching amount of the alkali etching is greater than the etching amount of the acid etching. Alternatively, in the etching step, reaction-controlled acid etching is first performed and then diffusion-controlled acid etching is performed. The etching amount of the reaction-controlled acid etching is greater than the etching amount of the diffusion-controlled acid etching. The method can remove a mechanically formed damage layer, improve surface roughness, and efficiently decrease the depth of locally formed deep pits, while the flatness of the wafer attained through lapping is maintained, in order to produce a chemically etched wafer having a smooth and flat etched surface that hardly causes generation particles and contamination.

11 Claims, 5 Drawing Sheets

SEMICONDUCTOR WAFERS PROCESSING METHOD AND SEMICONDUCTOR WAFERS PRODUCED BY THE SAME

BACKGROUND OF THE INVENTION

1. Field of the Invention

The present invention relates to an improvement on the method of removing, through chemical etching, a damaged layer that is generated on the surface of a monocrystalline silicon wafer during a process of producing the wafer.

2. Description of the Related Art

A conventional process of producing a mirror-polished semiconductor wafer typically comprises the steps of slicing a monocrystalline ingot of silicon or the like to obtain a semiconductor wafer; and chamfering, lapping, acid etching, mirror-polishing, and cleaning the sliced semiconductor wafer. Depending on the required specifications, the sequence of steps is changed; some steps are repeated a plurality of times; or other steps such as heat treatment and grinding are added to or replace the above-described steps. Thus, a variety of kinds of steps are performed in accordance with the specifications.

Among the above-described steps, acid etching is performed for the purpose of removing a surface damaged layer introduced in the course of mechanical machining steps such as slicing, chamfering, and lapping. In the acid etching step, the surface of a wafer is etched to a depth of a few to a few tens of microns through use of mixed acid aqueous solution composed of hydrofluoric acid, nitric acid, acetic acid, and water. However, acid etching involves the following problems:

1) The flatness of a wafer after lapping—which is indicated by thickness variation represented by, for example, TTV (Total Thickness Variation) ($\mu$m) or $LTV_{max}$ (Local Thickness Variation) ($\mu$m)— deteriorates as the etching amount increases.

2) A waviness of a millimeter order or an uneven region called "peel" is generated on an etched surface.

3) Harmful $NO_x$ is generated due to etching.

In consideration of these problems, alkali etching is used in some cases.

Alkali etching has the following advantages:

a) Flatness established by lapping is maintained after etching.

b) Generation of harmful gas is suppressed.

However, alkali etching has the following disadvantages:

i) If foreign mater enters pits locally existing on an etched surface and having a depth of a few microns and a diameter of a few to twelve or thirteen microns, the foreign matter causes generation of particles and/or contamination in a subsequent step.

ii) Since deep pits exist and surface roughness (Ra) increases, a polishing stock removal in a subsequent step of mirror-polishing (mechano-chemical polishing) must be increased.

iii) Since an etched surface has a sharp uneven shape compared to a surface etched through acid etching, the unevenness itself serves as a source of particles.

Accordingly, particles generated in a subsequent step and a polishing stock removal in a mirror-polishing step can be decreased if etching treatment can be performed while flatness attained through lapping is maintained, so as to remove a mechanically formed damage layer, improve the surface roughness, efficiently decrease the depth of deep pits locally formed due to the etching, and smooth the uneven shape of the surface.

SUMMARY OF THE INVENTION

The present invention has been accomplished to solve the above-mentioned problems, and an object of the invention is to provide a method of processing a semiconductor wafer which can remove a mechanically formed damage layer, improve surface roughness, and efficiently decrease the depth of locally formed deep pits, while the flatness of the wafer attained through lapping is maintained, in order to produce a chemically etched wafer (CW) having a smooth and flat etched surface that hardly causes generation of particles and contamination.

Another object of the invention is to provide a semiconductor wafer processed through the above-described processing method.

To achieve the above object, the present invention provides a method of processing a semiconductor wafer sliced from a monocrystalline ingot. The method comprises at least the steps of chamfering, lapping, etching, mirror-polishing, and cleaning and is characterized in that in the etching step alkali etching is first performed and then acid etching is performed, and that an etching amount of the alkali etching is greater than an etching amount of the acid etching.

In the etching step of the processing method of the present invention, after the step of lapping alkali etching is first performed in order to remove a mechanically formed damage layer, while the flatness of the wafer attained through lapping is maintained, and subsequently, acid etching is performed in order to decrease the depth of locally formed deep pits remaining after the alkali etching and to improve the surface roughness and the sharp uneven shape.

At this time, the etching amount of the alkali etching must be set greater than the etching amount of the acid etching because of the following reasons. That is, in order to decrease the depth of locally formed deep pits remaining after the alkali etching, the etching amount of the alkali etching must be increased to a certain level, which is greater than the etching amount of the acid etching required for decreasing the rate of generation of faults such as stain stemming from unevenness in etching and for improving flatness.

Preferably, before being subjected to the acid etching a wafer that has undergone the alkali etching is immersed into aqueous solution of hydrogen peroxide.

The surface of a wafer that has undergone the alkali etching is active and hydrophobic, so that foreign matter easily adheres and dirties the wafer. However, if the surface of the wafer is oxidized through immersion into aqueous solution of hydrogen peroxide and thus made hydrophilic, particles hardly adhere to the wafer surface.

Preferably, the etching amount of the alkali etching is 10–30 $\mu$m, and the etching amount of the acid etching is 5–20 $\mu$m.

In the alkali etching, there is a tendency that the depth of locally formed deep pits remaining after the alkali etching decreases with increasing etching amount, and that the surface roughness becomes higher with increasing etching amount of the alkali etching. Therefore, the etching amount of the alkali etching is maintained within the above-described range. In the acid etching, as the etching amount increases, the stain generation rate decreases considerably although the flatness deteriorates. Therefore, the etching amount of the acid etching is maintained within the above-described range.

Preferably, the etchant used in the alkali etching is an aqueous solution of NaOH or KOH, and the etchant used in the acid etching is a mixed acid aqueous solution composed of hydrofluoric acid, nitric acid, acetic acid, and water.

When such etchants are used, etching is performed effectively and reliably in both the alkali etching and the acid etching, and the respective etching amounts can be controlled with relative ease. In addition, the etching can be performed at low cost.

In the present specification, each specific value used in relation to etching amount represents the sum of the thicknesses of layers removed, through etching, from opposites surfaces of a wafer.

Preferably, the acid etching is reaction-controlled acid etching.

When the acid etching is of a reaction-controlled type, the flatness can be further improved through suppression of waviness, while realizing a decrease in the depth of deep pits locally remaining after the alkali etching and improvement of the surface roughness and the sharp uneven shape.

Preferably, in the reaction-controlled acid etching, there is used an etchant obtained through addition of 20–30 g/l of silicon into a mixed acid aqueous solution composed of hydrofluoric acid, nitric acid, acetic acid, and water.

When such etchant is used, etching is performed effectively and reliably, and the etching amount can be controlled with relative ease. In addition, the etching can be performed at low cost.

The present invention provides another method of processing a semiconductor wafer sliced from a monocrystalline ingot. The method comprises at least the steps of chamfering, lapping, etching, mirror-polishing, and cleaning and is characterized in that in the etching step reaction-controlled acid etching is first performed and then diffusion-controlled acid etching is performed, and that an etching amount of the reaction-controlled acid etching is greater than an etching amount of the diffusion-controlled acid etching.

In the etching step of the processing method of the present invention, reaction-controlled acid etching is first performed for a lapped wafer in order to remove a mechanically formed damage layer, while the flatness of the wafer attained through lapping is maintained, and subsequently, diffusion-controlled acid etching is performed in order to decrease the depth of deep pits remaining after the reaction-controlled acid etching and to improve the surface roughness and the sharp uneven shape.

At this time, the etching amount of the reaction-controlled acid etching must be set greater than the etching amount of the diffusion-controlled acid etching because of the following reasons. That is, in order to decrease the depth of locally formed deep pits remaining after the reaction-controlled acid etching, the etching amount of the reaction-controlled acid etching must be increased to a certain level, which is greater than the etching amount of the diffusion-controlled acid etching required for decreasing the rate of generation of faults such as stain stemming from unevenness in etching and for improving flatness.

Preferably, the etching amount of the reaction-controlled acid etching is 10–30 $\mu$m, and the etching amount of the diffusion-controlled acid etching is 5–20 $\mu$m.

In the reaction-controlled acid etching, there is a tendency that the depth of locally formed deep pits remaining after the etching decreases with increasing etching amount, and that the surface roughness increases with increasing etching amount of the reaction-controlled acid etching. Therefore, the etching amount of the reaction-controlled acid etching is maintained within the above-described range. In the diffusion-controlled acid etching, as the etching amount increases, the stain generation rate decreases considerably although flatness deteriorates. Therefore, the etching amount of the diffusion-controlled acid etching is maintained within the above-described range.

Preferably, in each of the reaction-controlled acid etching and the diffusion-controlled acid etching, there is used an etchant obtained through addition of silicon to a mixed acid aqueous solution composed of hydrofluoric acid, nitric acid, acetic acid, and water, and the silicon concentration of the etchant used in the reaction-controlled acid etching is higher than that of the etchant used in the diffusion-controlled acid etching.

When such etchants are used, etching is performed effectively and reliably in both the reaction-controlled acid etching and the diffusion-controlled acid etching, and the respective etching amounts can be controlled with relative ease. In addition, the etching can be performed at low cost.

Preferably, the silicon concentration of the etchant used in the reaction-controlled acid etching is 20–30 g/l, and the silicon concentration of the etchant used in the diffusion-controlled acid etching is 5–15 g/l.

When the silicon concentration of the etchant used in the reaction-controlled acid etching is less than 20 g/l, the etchant becomes a diffusion-controlled-type acid, so that flatness deteriorates. When the silicon concentration of the etchant used in the reaction-controlled acid etching exceeds 30 g/l, the etching rate decreases, and a longer period of time is required for dissolving silicon in a mixed acid aqueous solution in order to prepare the etchant. Therefore, the silicon concentration of the etchant used in the reaction-controlled acid etching is preferably adjusted to fall within the range of 20 to 30 g/l. When such reaction-controlled type acid etchants are used, etching is performed effectively and reliably, and the etching amount can be controlled with relative ease. In addition, the etching can be performed at low cost.

In the diffusion-controlled acid as well, small amount of silicon is preferably dissolved into the mixed acid aqueous solution in order to prevent variations in the etching rate, which would otherwise be caused by variations in the composition of the solution. When the silicon concentration is less than 5 g/l, a variation in the composition of the solution causes a large variation in the etching rate. When the silicon concentration is exceeds 15 g/l, the etching rate decreases, and the state of the surface of a wafer after etching becomes similar to that obtained through etching by use of a reaction-controlled-type acid, so that the surface roughness increases. Therefore, the silicon concentration of the etchant used in the diffusion-controlled acid etching is preferably adjusted to fall within the range of 5 to 15 g/l.

The present invention further provides a semiconductor wafer processed by either one of the above-described methods of the present invention. As described above, in one method of the present invention, alkali etching is first performed in order to remove a mechanically formed damage layer, while the flatness of the wafer attained through lapping is maintained, and subsequently, acid etching is performed. Therefore, there can be obtained a semiconductor wafer in which the depth of deep pits remaining after the alkali etching is decreased and the surface roughness and the sharp uneven shape are improved. Especially, when reaction-controlled acid etching is employed as the acid etching, the degree of waviness decreases, so that a semiconductor wafer having a flatter surface can be produced.

The above-described wafer can be obtained through the other method of the present invention, in which reaction-controlled acid etching is first performed and then diffusion-controlled acid etching is performed and in which the etching amount of the reaction-controlled acid etching is greater than the etching amount of the diffusion-controlled acid etching.

The present invention further provides a semiconductor wafer in which an $LTV_{max}$ measured in cells of 20×20 mm is 0.3 µm or less, and the maximal value of pit depth is 6 µm or less. In this case, the average value of waviness of the semiconductor wafer is preferably 0.04 µm or less.

As described above, according to the present invention, the flatness of the wafer attained through lapping is maintained; the degree of waviness of the wafer surface after etching is decreased; deep pits are prevented from being locally generated; and degradation of surface roughness is suppressed. Thus, there is obtained a chemically etched wafer having a smooth and flat etched surface that hardly causes generation of particles and contamination such as stain. Therefore, the amount of stock removal in a mirror-polishing step can be decreased, and the flatness of the wafer can be improved.

DESCRIPTION OF THE PREFERRED EMBODIMENTS

Embodiments of the present invention will now be described with reference to the drawings; however, the embodiments should not be construed as limiting the present invention.

The inventors of the present invention performed various studies on a method of processing a semiconductor wafer, especially on the etching method, that can produce a chemically etched wafer which maintains its flatness attained through lapping and which has an etched surface that hardly causes generation of particles and contamination. Based on the studies, the inventors of the present invention conceived a wafer processing method in which alkali etching is first performed in order to remove a damage layer, while the flatness of the wafer attained through lapping is maintained, and subsequently, acid etching is performed in order to decrease the depth of remaining deep pits and to improve the surface roughness while decreasing the degree of waviness, as well as a wafer processing method in which reaction-controlled acid etching is performed as the above-described acid etching. The present invention was achieved on the basis of this concept and through thorough investigations of other conditions.

First, alkali etching will be described in detail.

Figure 1:
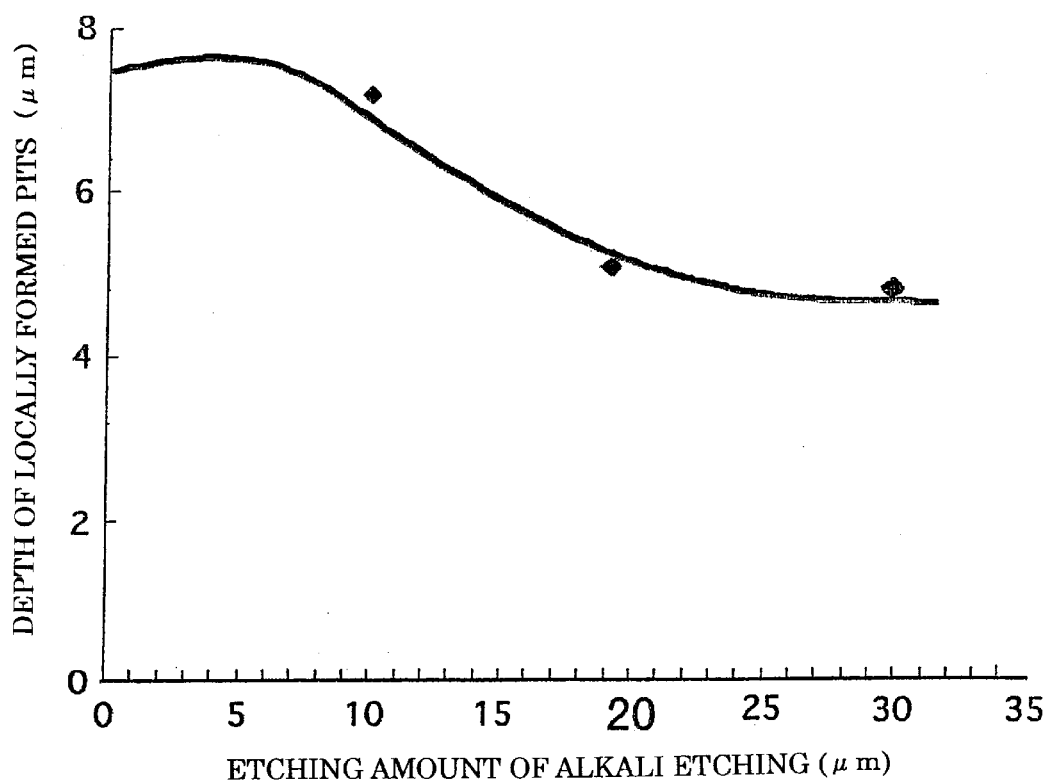
FIG. 1 is a graph showing the relationship between etching amount and depth of locally formed deep pits in wafers that have undergone alkali etching after lapping.
Figure 2:
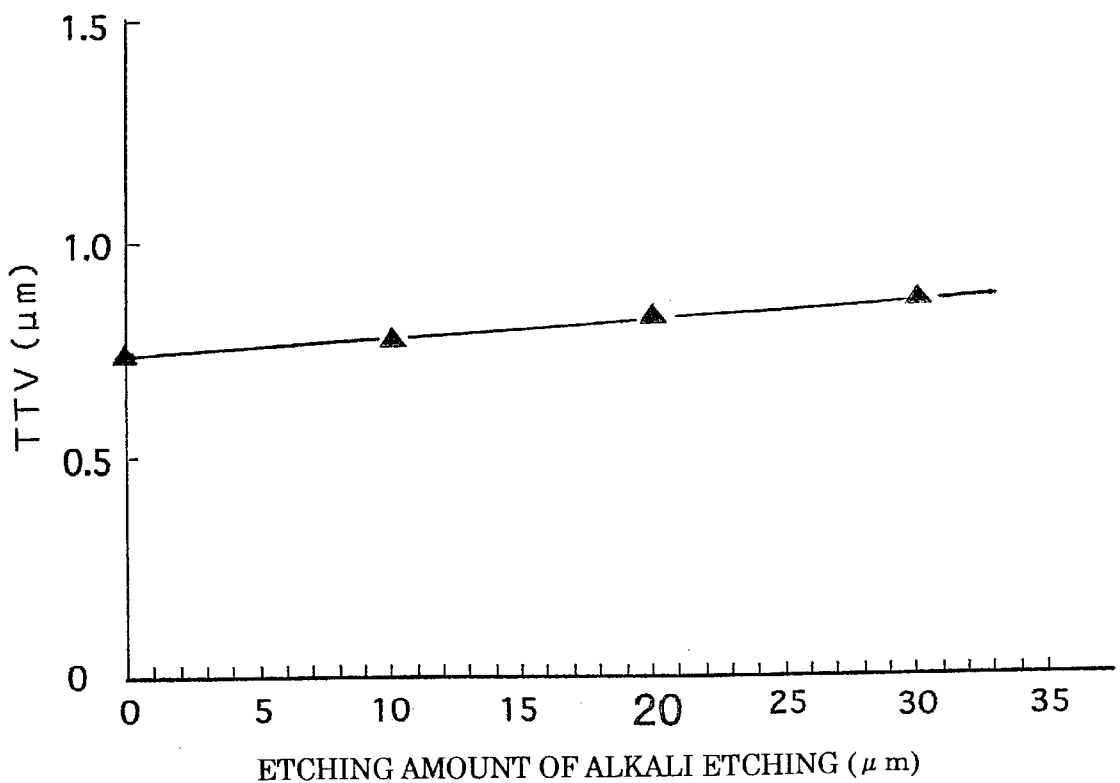
FIG. 2 is a graph showing the relationship between etching amount and TTV (flatness) in wafers that have undergone alkali etching after lapping.
Figure 3:
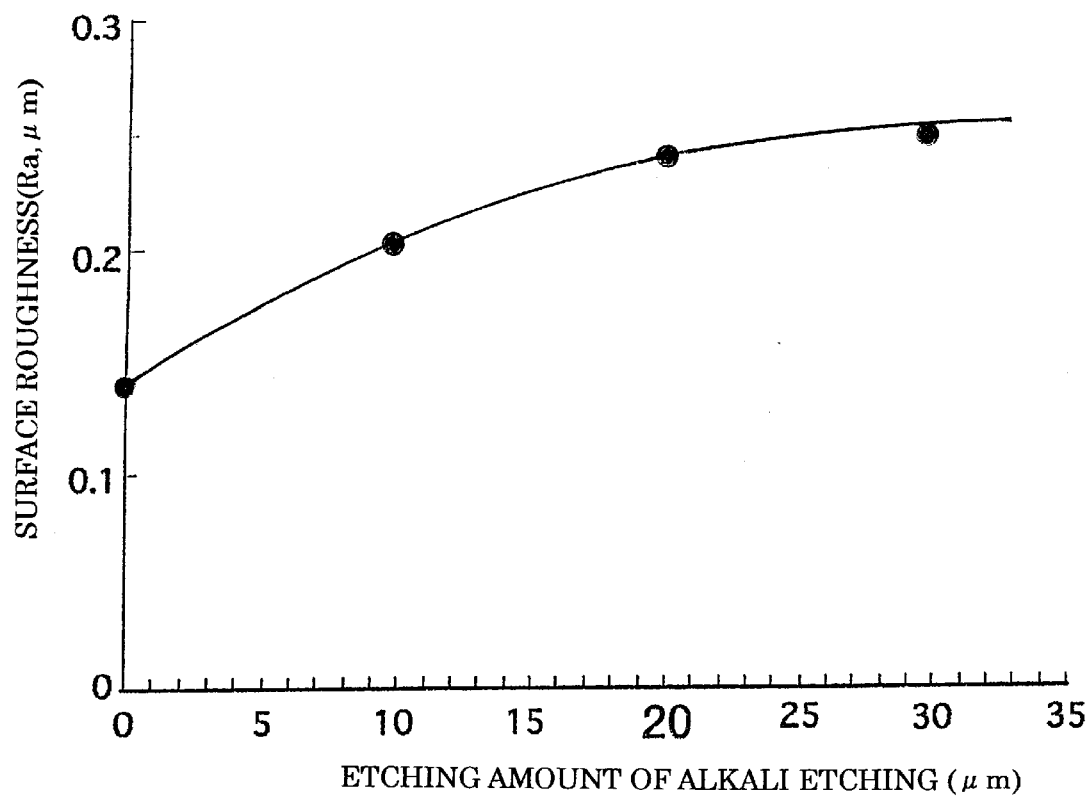
FIG. 3 is a graph showing the relationship between etching amount and surface roughness (Ra) in wafers that have undergone alkali etching after lapping.

FIG. 1 shows the relationship between etching amount and depth of locally formed deep pits in 8-inch wafers which were alkali-etched at 85° C. through use of an aqueous 50% NaOH solution after being lapped by use of #1200 lapping abrasive grains. FIG. 2 shows the relationship between etching amount and TTV (flatness) in the 8-inch wafers, and FIG. 3 shows the relationship between etching amount and surface roughness (Ra) in the 8-inch wafers.

The locally formed deep pits are formed as follows. When lapping abrasive grains stick in the surface of a wafer during lapping, there are formed pits, whose diameter and depth are then increased due to alkali etching. Thus, deep pits are formed. When the concentration of the alkaline compound is low, the pit depth tends to increase. When the concentration of an alkaline compound is high, the pit depth can be decreased. However, in this case, the etching amount must be increased, resulting in a lowered efficiency. The pit depth is determined based on the focal depth of an optical microscope. Such pits must be removed through polishing in a subsequent mirror-polishing step, and therefore the polishing stock removal in the mirror-polishing step must be set greater than the maximum value of the depth of such deep pits. Accordingly, the depth of pits is desirably decreased to a possible extent.

TTV (Total Thickness Variation) (µm) represents the difference between the thickness of a thickest portion and that of a thinnest portion of a single wafer and is an indication of wafer flatness. LTV (Local Thickness Variation) (µm) represents the difference between the thickness of a thickest portion and that of a thinnest portion within each of cells (typically 20×20 mm, or 25×25 mm) defined on a single wafer. The LTV of each cell is called $LTV_{cbc}$, and the maximum LTV within a single wafer is called $LTV_{max}$, and these also serve as indications of wafer flatness.

Ra (µm) represents an arithmetical mean deviation of profile, which is the most commonly used parameter of surface roughness.

As is understood from FIG. 1, in order to decrease the depth of locally formed deep pits, the etching amount of alkali etching must be set to not less than 10 µm. As is understood from FIG. 2, in order to decrease TTV to 1 µm or less, the etching amount of alkali etching must be set to 30 µm or less. As is understood from FIG. 3, in order to decrease Ra to 0.25 µm or less, the etching amount of alkali etching must be set to 30 µm or less. In consideration of the above, a suitable range of the etching amount of the alkali etching is 10 to 30 µm. Especially, an etching amount of about 20 µm is preferred because the depth of locally formed deep pits approaches its minimal value (approximately 5 µm), and TTV and Ra do not increase greatly.

Next, the etching amount of acid etching was studied.

Figure 4:
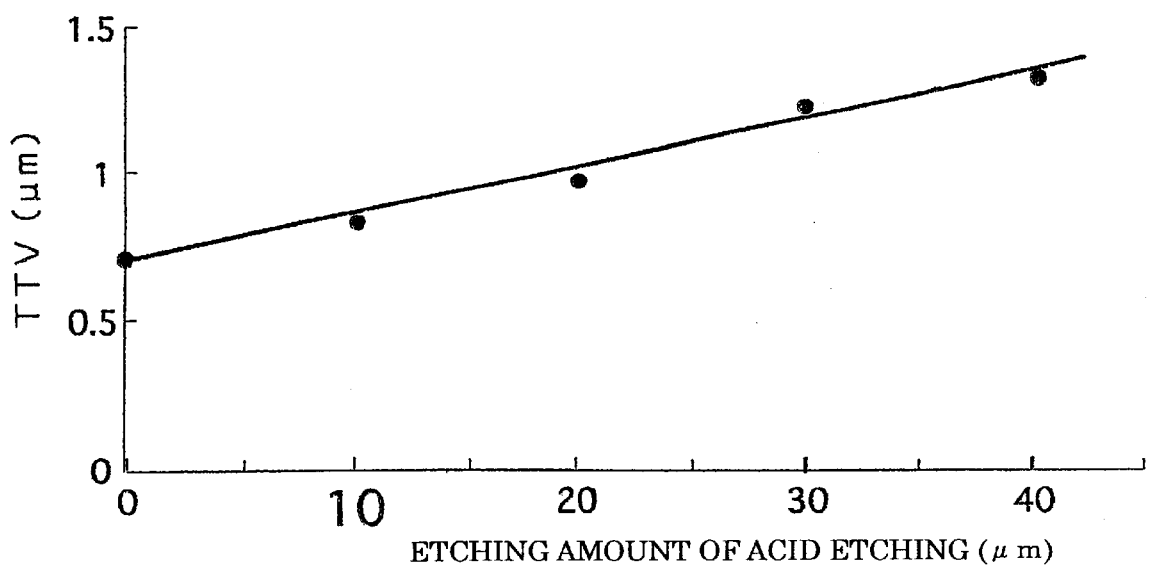
FIG. 4 is a graph showing the relationship between etching amount and TTV (flatness) in wafers that have undergone acid etching after lapping.

FIG. 4 shows the relationship between average etching amount and TTV after etching in 8-inch wafers which were etched through use of a mixed acid (50% hydrofluoric acid:70% nitric acid:99% acetic acid=1:2:1 (volume ratio)) after being lapped by use of #1200 lapping abrasive grains. In this case, silicon is dissolved in the mixed acid etchant with a concentration of 10 g/l to improve controllability of etching rate. Consequently this acid etching is diffusion-controlled type.

Figure 5:
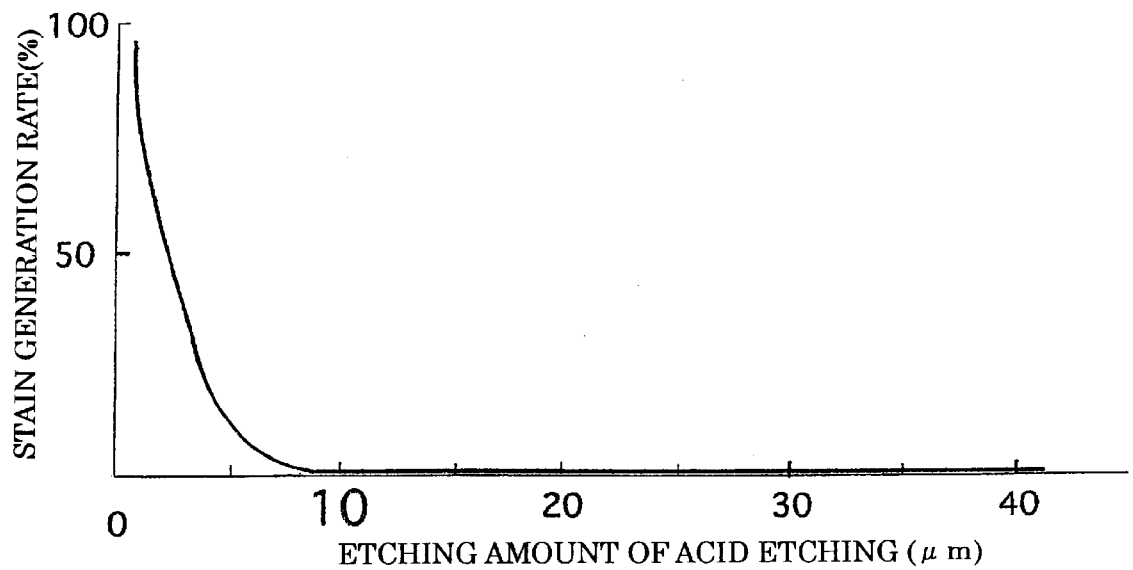
FIG. 5 is a graph showing the relationship between etching amount and stain generation rate in wafers that have undergone acid etching after lapping.

FIG. 5 shows the relationship between etching amount and stain generation rate due to uneven etching in wafers that were chemically etched through acid etching. The generation of stain was determined through visual inspection under collimated light.

As is understood from FIG. 5, in order to avoid generation of stain, the etching amount of acid etching must be set to not less than 5 µm, and in order to reliably eliminate stain, the etching amount of acid etching must be set to not less than 10 µm. As is understood from FIG. 4, in order to decrease TTV to 1 µm or less, the etching amount of acid etching must be set to 20 µm or less. In consideration of the above, a suitable range of the etching amount of the acid etching is 5 to 20 µm and the etching amount is preferably set to approximately 10 µm.

In the above description, the relationship between the etching amount of alkali etching and its etching effect is discussed separately from the relationship between the etching amount of acid etching and its etching effect. However, in the present invention, alkali etching and acid etching are both used, and the acid etching is performed after the alkali etching in order to fully utilize the characteristics of both etchings, so that a sufficient degree of etching effect is attained.

That is, alkali etching is first performed in order to remove a mechanically formed damage layer, while the flatness of the wafer attained through lapping is maintained, and acid etching is then performed. Thus, the depth of locally formed deep pits remaining after the alkali etching can be decreased; the surface uneven shape can be smoothed in order to improve the surface roughness; and the stain generation rate can be decreased.

At this time, the etching amount of the alkali etching must be set greater than the etching amount of the acid etching because of the following reasons. That is, in order to decrease the depth of locally formed deep pits remaining after the alkali etching, the etching amount of the alkali etching must be increased to a certain level, which is greater than the etching amount of the acid etching required for decreasing the rate of generation of stain and for improving flatness.

In the present invention, a wafer that has undergone the alkali etching is preferably immersed into aqueous solution of hydrogen peroxide before being subjected to the acid etching. The surface of a wafer that has undergone the alkali etching is active and hydrophobic, so that foreign matter easily adheres and dirties the wafer. However, if through immersion into aqueous solution of hydrogen peroxide the surface of the wafer is oxidized and thus made hydrophilic, so that particles hardly adhere to the wafer surface, which particles would otherwise contaminate an acid etchant used in the subsequent step.

The concentration of hydrogen peroxide is preferably set to 0.1–30%. Concentrations less than 0.1% cannot make the surface of a wafer hydrophilic to a sufficient degree. A concentration as high as 30% provides a sufficient effect, and therefore concentrations higher than 30% are disadvantageous from a viewpoint of economy.

Next, reaction-controlled acid etching will be described.

In the reaction-controlled acid etching, there is used an etchant obtained through dissolution of 20–30 g/l of silicon into a mixed acid aqueous solution composed of hydrofluoric acid, nitric acid, acetic acid, and water. The mixed acid aqueous solution causes an etching action relatively close to that of alkali etchant.

The etchant used in the reaction-controlled acid etching is called a reaction-controlled acid etchant because its reaction speed is controlled or determined, in contrast to an ordinarily mixed acid aqueous solution used in ordinary acid etching, which is a diffusion-controlled acid.

When the reaction-controlled acid etching is combined with the alkali etching, alkali etching is first performed in order to remove a mechanically formed damage layer, while the flatness of the wafer attained through lapping is maintained, and the reaction-controlled acid etching is then performed. Thus, the depth of locally formed deep pits remaining after the alkali etching can be decreased; the surface uneven shape can be smoothed in order to improve the surface roughness; and the stain generation rate can be decreased. Further, since the degree of waviness can be decreased compared to the case where diffusion-controlled acid etching is performed, the flatness of the wafer can be further improved.

The above-described two-stage chemical etching; i.e., alkali etching plus acid etching, according to the present invention enables easy and stable production of a semiconductor wafer which has a flatness ($LTV_{max}$ in 20×20 mm cells) of 0.3 µm or less and a maximum pit depth of 6 µm or less.

Further, a semiconductor wafer can be processed to have an excellent flatness in a large area such that the average value of waviness is 0.04 µm or less.

Next, another embodiment of the present invention will be described with reference to the drawings; however, the embodiment should not be construed as limiting the present invention.

The inventors of the present invention performed various studies on a method of processing a semiconductor wafer that can produce a chemically etched wafer which maintains its flatness attained through lapping and which has an etched surface that hardly causes generation of particles and contamination, especially studies on the etching method. Based on the studies, the inventors of the present invention conceived a wafer processing method in which reaction-controlled acid etching is first performed in order to remove a damage layer, while the flatness of the wafer attained through lapping is maintained, and subsequently, diffusion-controlled acid etching is performed in order to decrease the depth of remaining deep pits and to improve the surface roughness. The present invention was achieved on the basis of this concept and through thorough investigations of other conditions.

In the reaction-controlled acid etching, there is used an etchant obtained through dissolution of 20–30 g/l of silicon into a mixed acid aqueous solution (for example, 50% hydrofluoric acid:70% nitric acid:99% acetic acid=1:2:1). This etchant was found while the present inventors studied the etching action of the above-described mixed acid aqueous solution, and causes an etching action relatively close to that of alkali etchant. The present inventors decided to call the etchant a "reaction-controlled type acid" because the etchant dominantly effects reaction-controlled acid etching, in contrast to the mixed acid aqueous solution used in ordinary acid etching, which is a diffusion-controlled acid. The present inventors decided to call the ordinary mixed acid aqueous solution a "diffusion-controlled type acid."

The etching through use of the reaction-controlled type acid has the following advantages:

a) Flatness established by lapping is maintained after etching.

b) Etching through use of the reaction-controlled type acid can be performed at temperatures near room temperature, whereas alkali etching is typically performed at temperatures near 80° C.

However, the etching through use of the reaction-controlled type acid has the following disadvantages:

i) If foreign mater enters pits locally existing on an etched surface and having a depth of a few microns and a diameter of a few to twelve or thirteen microns, the foreign matter causes generation of particles and/or contamination in a subsequent step.

ii) Since deep pits exist and surface roughness (Ra) increases, a polishing stock removal in a subsequent step of mirror-polishing (mechano-chemical polishing) must be increased.

iii) Since an etched surface has a sharp uneven shape compared to a surface etched through diffusion-controlled acid etching (acid etching through use of an ordinary mixed acid), the unevenness itself serves as a source of particles.

When the solution temperature during etching is lower than 20° C., the etching rate decreases, and when the solution temperature during etching exceeds 45° C., diffusion-controlled acid etching occurs dominantly, so that the flatness of an etched wafer deteriorates. Therefore, the etching temperature is preferably set to fall within the range of 20 to 45° C.

When the silicon concentration of the etchant used in the reaction-controlled acid etching is less than 20 g/l, diffusion-controlled acid etching occurs dominantly, so that the flatness of an etched wafer deteriorates. When the silicon concentration of the etchant used in the reaction-controlled acid etching exceeds 30 g/l, the etching rate decreases, and a longer period of time is required for dissolving silicon in a mixed acid aqueous solution in order to prepare the etchant. Therefore, the silicon concentration of the etchant used in the reaction-controlled acid etching is preferably adjusted to fall within the range of 20 to 30 g/l.

Figure 7:
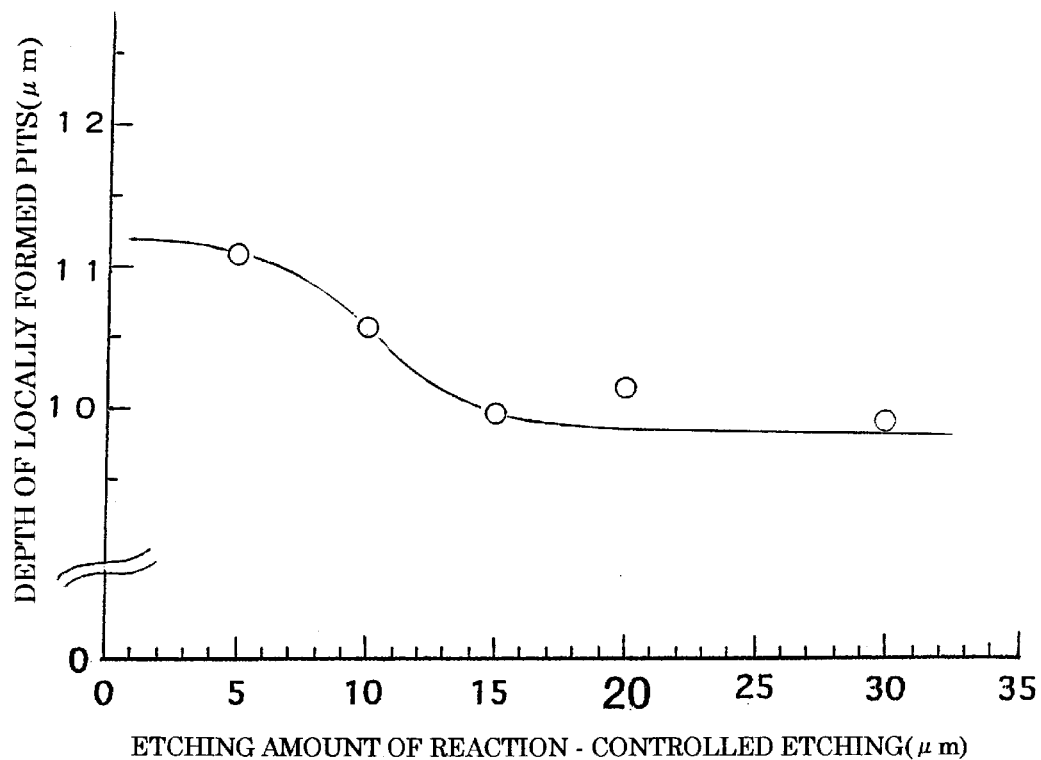
FIG. 7 is a graph showing the relationship between etching amount and depth of locally formed deep pits in wafers that have undergone reaction-controlled acid etching after lapping.
Figure 8:
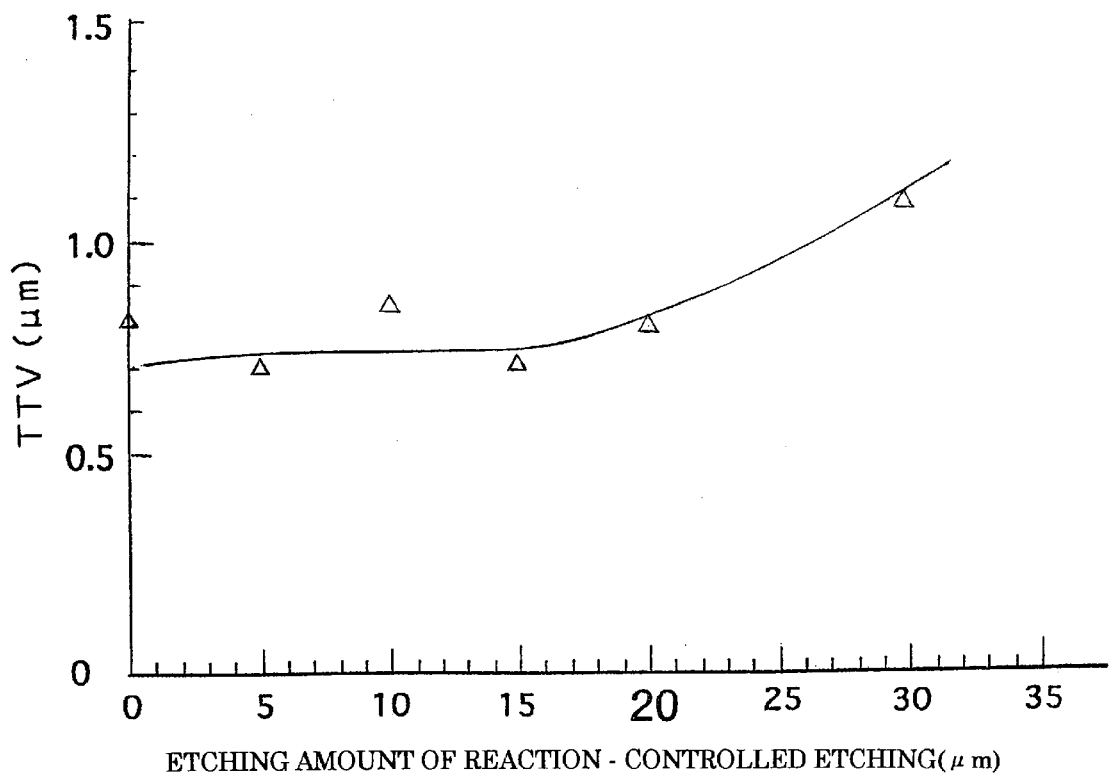
FIG. 8 is a graph showing the relationship between etching amount and TTV (flatness) in wafers that have undergone reaction-controlled acid etching after lapping.
Figure 9:
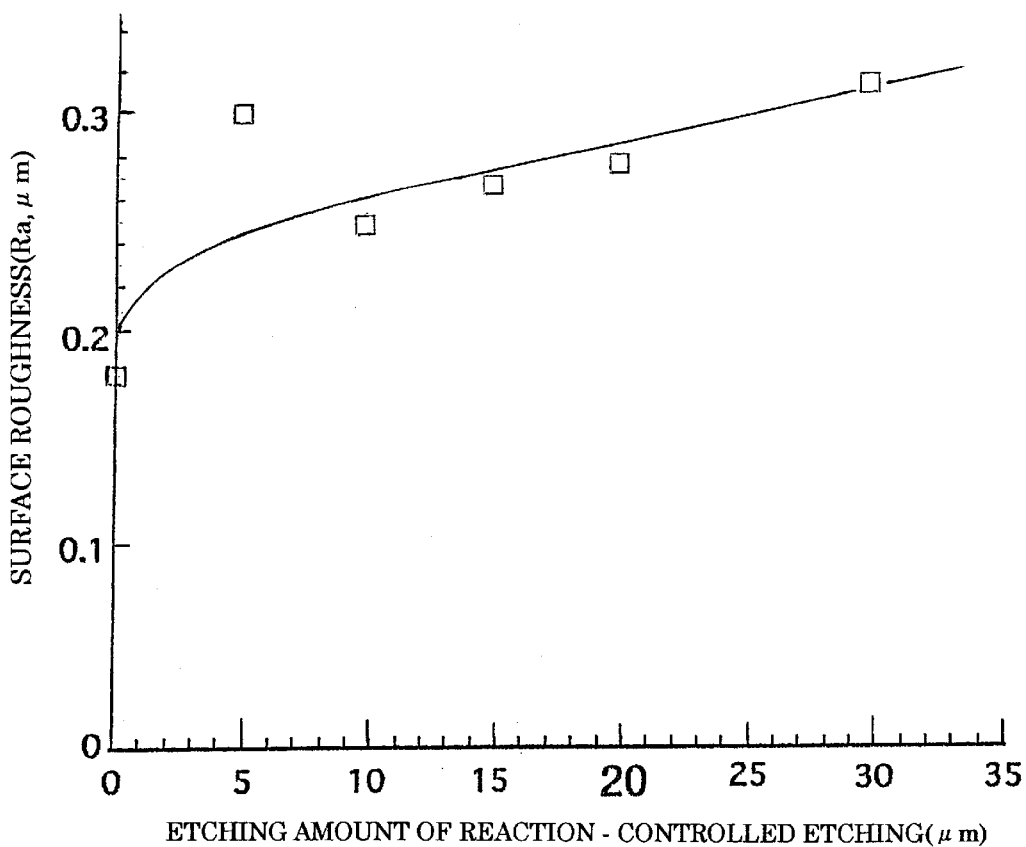
FIG. 9 is a graph showing the relationship between etching amount and surface roughness (Ra) in wafers that have undergone reaction-controlled acid etching after lapping.
Figure 10:
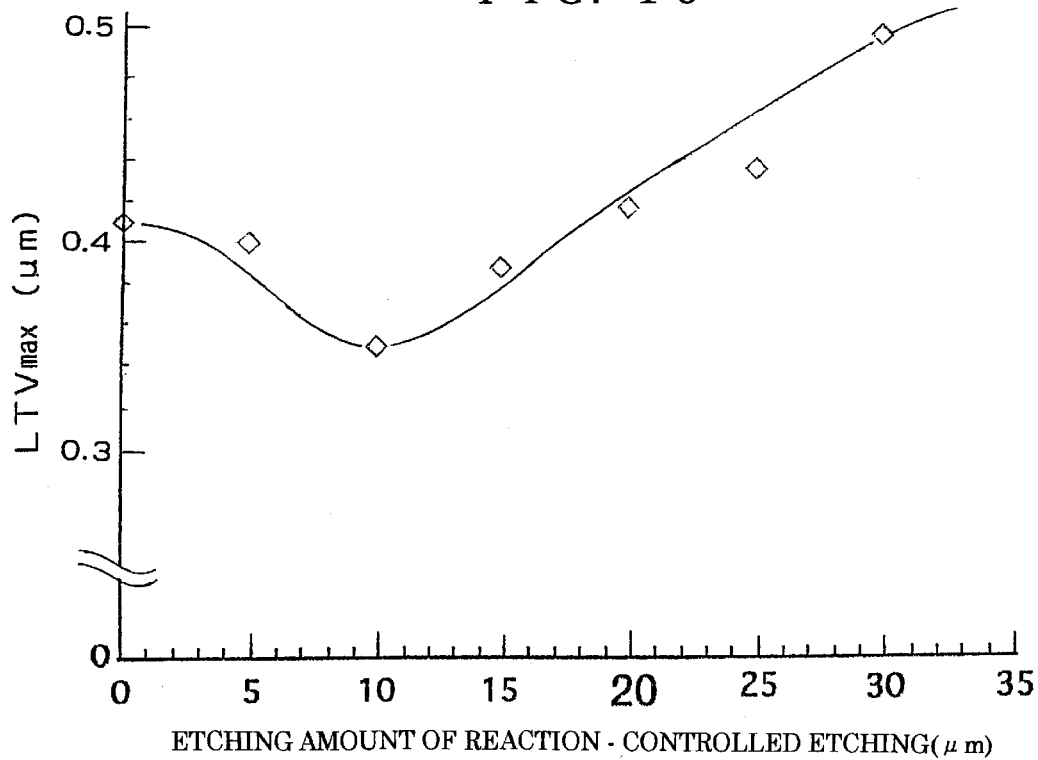
FIG. 10 is a graph showing the relationship between etching amount and $LTV_{max}$ (flatness) in wafers that have undergone reaction-controlled acid etching after lapping.

FIG. 7 shows the relationship between etching amount and depth of locally formed deep pits in 8-inch wafers which were etched at 35° C. through use of a reaction-controlled type acid etchant obtained through dissolution of 26 g/l of silicon into a mixed acid (50% hydrofluoric acid:70% nitric acid:99% acetic acid=1:2:1 (volume ratio)) after being lapped by use of #1200 lapping abrasive grains. FIG. 8 shows the relationship between etching amount and TTV in the 8-inch wafers. FIG. 9 shows the relationship between etching amount and surface roughness (Ra) in the 8-inch wafers. FIG. 10 shows the relationship between etching amount and $LTV_{max}$ in the 8-inch wafers.

The locally formed deep pits are formed as follows. When lapping abrasive grains stick in the surface of a wafer during lapping, there are formed pits, whose diameter and depth are then increased due to reaction-controlled acid etching. Thus, deep pits are formed. When the concentration of silicon is low, the pit depth tends to increase. When the concentration of silicon is high, the pit depth can be decreased. However, in this case, the etching amount must be increased, resulting in a lowered efficiency. The pit depth is determined based on the focal depth of an optical microscope. Such pits must be removed through polishing in a subsequent mirror-polishing step, and therefore the polishing amount in the mirror-polishing step must be set greater than the maximum value of the depth of such deep pits. Accordingly, the depth of pits is desirably decreased to a possible extent.

As is understood from FIG. 7, in order to decrease the depth of locally formed deep pits, the etching amount of reaction-controlled acid etching must be set to not less than 10 μm. As is understood from FIGS. 8, 9, and 10, the etching amount of reaction-controlled acid etching must be set to 30 μm or less in order to decrease TTV to 1 μm or less, Ra to 0.30 μm or less, and $LTV_{max}$ to 0.50 μm or less. In consideration of the above, a suitable range of the etching amount of the reaction-controlled acid etching is 10 to 30 μm. Especially, an etching amount of about 20 μm is preferred because the depth of locally formed deep pits approaches its minimal value (approximately 10 μm), and TTV and Ra do not increase greatly.

Next, the etching amount of diffusion-controlled acid etching was studied.

In the diffusion-controlled type acid as well, a small amount of silicon is preferably dissolved into the mixed acid aqueous solution in order to prevent variations in the etching rate, which would otherwise be caused by variations in the composition of the solution. When the silicon concentration is less than 5 g/l, a variation in the composition of the solution causes a large variation in the etching rate. When the silicon concentration exceeds 15 g/l, the etching rate decreases, and the state of the surface of a wafer after etching becomes similar to that obtained through etching by use of a reaction-controlled type acid, so that the surface roughness increases. Therefore, the silicon concentration of the etchant used in the diffusion-controlled acid etching is preferably adjusted to fall within the range of 5 to 15 g/l.

As is understood from FIG. 5, in order to avoid generation of stain, the etching amount of the diffusion-controlled acid etching must be set to not less than 5 μm, and in order to reliably eliminate stain, the etching amount of the diffusion-controlled acid etching must be set to not less than 10 μm. As is understood from FIG. 4, in order to decrease TTV to 1 μm or less, the etching amount of acid etching must be set to 20 μm or less. In consideration of the above, a suitable range of the etching amount of the diffusion-controlled acid etching is 5 to 20 μm, and the etching amount is preferably set to approximately 10 μm.

In the above description, the relationship between the etching amount of reaction-controlled acid etching and its etching effect is discussed separately from the relationship between the etching amount of diffusion-controlled acid etching and its etching effect. However, in the present embodiment, reaction-controlled acid etching and diffusion-controlled acid etching are both used, and the diffusion-controlled acid etching is performed after the reaction-controlled acid etching in order to fully utilize the characteristics of both etchings, so that a sufficient degree of etching effect is attained.

That is, reaction-controlled acid etching is first performed in order to remove a mechanically formed damage layer, while the flatness of the wafer attained through lapping is maintained, and diffusion-controlled acid etching is then performed. Thus, the depth of locally formed deep pits remaining after the reaction-controlled acid etching can be decreased; the surface uneven shape can be smoothed in order to improve the surface roughness; and the stain generation rate can be decreased.

At this time, the etching amount of the reaction-controlled acid etching must be set greater than the etching amount of the diffusion-controlled acid etching because of the following reasons. That is, in order to decrease the depth of locally formed deep pits remaining after the reaction-controlled acid etching, the etching amount of the reaction-controlled acid etching must be increased to a certain level, which is greater than the etching amount of the diffusion-controlled acid etching required for decreasing the stain generation rate and for improving flatness.

EXAMPLES

The present invention will be described by way of examples; however, the present invention is not limited thereto.

Example 1

The following etching treatment was performed for wafers having a diameter of 8 inches that had undergone lapping (#1200 lapping abrasive grains).

First, the wafers were immersed in an NaOH aqueous solution (concentration: 50 wt. %) at 85° C. for 450 seconds in order to perform alkali etching with a target etching amount being set to 20 µm. Subsequently, the wafers were dipped into an aqueous solution of 0.3% hydrogen peroxide in order to make the surface of the wafers hydrophilic. Finally, the wafers were immersed into a mixed acid (50% hydrofluoric acid:70% nitric acid:99% acetic acid=1:2:1 (volume ratio)) in order to perform acid etching with a target etching amount being set to 10 µm. The etched wafers were measured for flatness, surface roughness, pit depth, and waviness in order to evaluate the effect of etching. The results are shown in Table 1.

The actual etching amounts of the alkali etching and the acid etching were as follows.

The etching amount of the alkali etching (target value: 20 µm): number of samples: 51, average value: 20.1 µm, average value±3σ: 18.1–22.1 µm. The etching amount of the acid etching (target value: 10 µm): number of samples: 107, average value: 9.8 µm, average value±3σ: 8.3–11.3 µm.

Flatness (TTV, LTV) was measured by use of a flatness measuring device (U/G9500, U/S9600, products of ADE Corp.). Surface roughness (Ra) was measured by use of a universal surface shape measuring device (Type: SE-3C, product of Kosaka Laboratory Co.).

Further, waviness was measured by use of the universal surface shape measuring device (Type: SE-3C, product of Kosaka Laboratory Co.). Specifically, a central area of the surface of a wafer (diameter: 200 mm) was traced for 60 mm through use of a stylus within in order to measure the surface shape while the component of fine surface roughness was eliminated.

Figure 6:
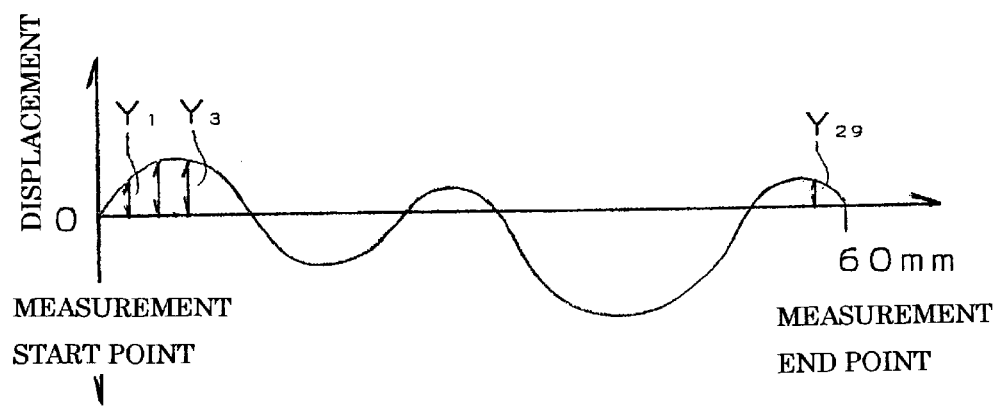
FIG. 6 is an explanatory diagram showing a definition of waviness of the surface of a wafer.

Waviness is defined as shown in FIG. 6. The vertical position of a start point and an end point of measurement that are determined to have the same height is assumed as the origin in the vertical or height direction. The absolute values $Y_1$ to $Y_{29}$ of displacement from the origin are measured at intervals of 2 mm. The average Y of the absolute values $Y_1$ to $Y_{29}$ represents waviness.

TABLE 1

| | | Items | | | | |
|---|---|---|---|---|---|---|
| Ex. No. | Measured wafers | TTV Ave. (µm) | $LTV_{max}$[1] Ave. (µm) | Ra Ave. (µm) | Pit depth Max. (µm) | Waviness Ave. (µm) |
| Example 1 | 50 | 0.99 | 0.55 | 0.18 | 5.5 | 0.062 |
| Comparative example 1 | 50 | 1.28 | 0.70 | 0.11 | 4.5 | — |
| Comparative example 2 | 50 | 0.93 | 0.38 | 0.24 | 8.2 | — |
| Example 2 | 50 | 0.56 | 0.27 | 0.22 | 5.8 | 0.033 |
| Example 3 | 50 | 0.56 | 0.27 | 0.19 | 5.2 | 0.023 |

Note [1]: Maximum value among values measured in cells of 20 × 20 mm over the entire wafer surface.

Comparative Example 1

Alkali etching was first performed under the same conditions as in Example 1 except that the target etching amount was set to 4 µm, and immediately after the alkali etching, acid etching was performed with a target etching amount being set to 36 µm. There was not performed a treatment for making the surface of the wafers hydrophilic through use of an aqueous solution of hydrogen peroxide. The results of measurement performed for the thus-etched wafers are shown in Table 1.

Comparative Example 2

Only the alkali etching employed in Example 1 with a target etching amount being set to 20 µm was performed for wafers. The results of measurement performed for the thus-etched wafers are shown in Table 1.

Table 1 demonstrates the following. When only alkali etching is performed (Comparative Example 2), although the flatness of each wafer is good, the surface roughness deteriorates, and especially, the depth of locally formed deep pits increases. When acid etching is performed after alkali etching (Comparative Example 1), the flatness of wafer becomes considerably worse because of the large acid etching amount. By contrast, when alkali etching and acid etching are performed with their etching amounts being properly set (Example 1), well-balanced results are obtained in terms of flatness, surface roughness, and depth of deep pits. Further, observation of the surface shape through use of a microscope reveals that the wafers obtained in Example 1 have a surface shape smoother than that of the wafers obtained in Comparative Example 2 and as smooth as that of the wafers obtained in Comparative Example 1.

Example 2

The following etching treatment was performed for wafers having a diameter of 8 inches that had undergone lapping (#1200 lapping abrasive grains).

First, the wafers were immersed in an NaOH aqueous solution (concentration: 50 wt. %) at 85° C. for 450 seconds in order to perform alkali etching with a target etching amount being set to 20 µm. Subsequently, the wafers were dipped into an aqueous solution of 0.3% hydrogen peroxide in order to make the surface of the wafers hydrophilic. Finally, the wafers were immersed into a reaction-controlled acid etchant obtained through dissolution of 27.5 g/l of silicon into a mixed acid (50% hydrofluoric acid:70% nitric acid:99% acetic acid=1:2:1 (volume ratio)) in order to perform reaction-controlled acid etching with a target etching amount being set to 10 µm. The etched wafers were measured for flatness, surface roughness, pit depth, and waviness in order to evaluate the effect of etching. The results are shown in Table 1. The results demonstrate that the reaction-controlled acid etching is especially effective for improvement of flatness (TTV, $LTV_{max}$) and waviness.

Example 3

Alkali etching and reaction-controlled acid etching were performed under same conditions as in Example 2 for 8-inch wafers that undergone lapping through combined use of #1200 abrasive grains and #1500 abrasive grains. The etched wafers were measured for flatness, surface roughness, pit depth, and waviness in order to evaluate the effect of etching. The results are shown in Table 1. The results obtained in this example demonstrate that the reaction-controlled acid etching is especially effective for improvement of flatness (TTV, $LTV_{max}$) and waviness.

Example 4

The following etching treatment was performed for wafers having a diameter of 8 inches that had undergone lapping (#1200 lapping abrasive grains).

First, the wafers were immersed in a reaction-controlled acid etchant obtained through dissolution of 26 g/l of silicon into a mixed acid (50% hydrofluoric acid:70% nitric acid:99% acetic acid=1:2:1 (volume ratio)) at 35° C. for 150 seconds in order to perform reaction-controlled acid etching with a target etching amount being set to 20 μm. Subsequently, the wafers were immersed into a diffusion-controlled acid etchant obtained through dissolution of 10 g/l of silicon into a mixed acid (50% hydrofluoric acid:70% nitric acid:99% acetic acid=1:2:1 (volume ratio)) in order to perform diffusion-controlled acid etching with a target etching amount being set to 10 μm. The etched wafers were measured for flatness, surface roughness, pit depth, and waviness in order to evaluate the effect of etching. The results are shown in Table 2.

The actual etching amounts of the reaction-controlled acid etching and the diffusion-controlled acid etching were as follows.

Etching amount of the reaction-controlled acid etching (target value: 20 μm): number of samples: 50, average value: 20.1 μm, average value±3σ: 18.1–22.1 μm. Etching amount of the diffusion-controlled acid etching (target value: 10 μm): number of samples: 50, average value: 9.8 μm, average value±3σ: 8.3–11.3 μm.

Flatness (TTV, LTV) was measured by use of a flatness measuring device (U/G9500, U/S9600, products of ADE Corp.). Surface roughness (Ra) was measured by use of a universal surface shape measuring device (Type: SE-3C, product of Kosaka Laboratory Co.).

TABLE 2

| Ex. No. | Measured wafers | TTV Ave. (μm) | $LTV_{max}$[1] Ave. (μm) | Ra Ave. (μm) | Pit depth Max. (μm) |
|---|---|---|---|---|---|
| Example 4 | 50 | 1.02 | 0.56 | 0.20 | 6.4 |
| Comparative example 3 | 50 | 1.35 | 0.75 | 0.15 | 5.2 |
| Comparative example 4 | 50 | 0.98 | 0.40 | 0.29 | 10.1 |

Note [1]: Maximum value among values measured in cells of 20 × 20 mm over the entire wafer surface.

Comparative Example 3

Reaction-controlled acid etching was first performed under the same conditions as in Example 4 except that the target etching amount was set to 4 μm, and immediately after the reaction-controlled acid etching, diffusion-controlled acid etching was performed with a target etching amount being set to 26 μm. The results of measurement performed for the thus-etched wafers are shown in Table 2.

Comparative Example 4

Wafers were subjected to only the reaction-controlled acid etching employed in Example 4 with a target etching amount being set to 30 μm. The results of measurement performed for the thus-etched wafers are shown in Table 2.

Table 2 demonstrates the following. When only reaction-controlled acid etching is performed (Comparative Example 4), although the flatness of wafer is good, the surface roughness deteriorates, and especially, the depth of locally formed deep pits increases. When diffusion-controlled acid etching is performed after reaction-controlled acid etching (Comparative Example 3), the etching amount of the diffusion-controlled acid etching is excessive, so that the flatness of wafer deteriorates considerably. By contrast, when reaction-controlled acid etching and diffusion-controlled acid etching are performed with their etching amounts being properly set (Example 4), well-balanced results are obtained in terms of flatness, surface roughness, and depth of deep pits. Further, observation of the surface shape through use of a microscope reveals that the wafers obtained in Example 4 have a surface shape smoother than that of the wafers obtained in Comparative Example 4 and as smooth as that of the wafers obtained in Comparative Example 3.

The present invention is not limited to the above-described embodiment. The above-described embodiment is a mere example, and those having the substantially same structure as that described in the appended claims and providing the similar action and effects are included in the scope of the present invention.

For example, additives such as surfactants may be added to the alkali etchants and the acid etchants used in the above-described embodiments. More specifically, when nitrite such as $NaNO_2$ is added to the alkali etchant, the depth of pits can be reduced more effectively. When a fluorine-contained or nonionic surfactant is added to the acid etchant, generation of stain can be reduced more effectively.

In the above-described one embodiment, a mixed acid aqueous solution composed of hydrofluoric acid, nitric acid, acetic acid, and water is described as an example of the acid etchant. However, similar effects are attained even when there is used a mixed acid aqueous solution composed of hydrofluoric acid, nitric acid, and water but does not contain acetic acid.

In the above-described the other embodiment, an etchant obtained through dissolution of silicon into a mixed acid aqueous solution composed of hydrofluoric acid, nitric acid, acetic acid, and water is described an example of the etchants used in the reaction-controlled acid etching and the diffusion-controlled acid etching. However, the present invention can be applied to the case where there is used an etchant obtained through addition of acetic acid, phosphoric acid, or sulfuric acid into a three-component mixed acid aqueous solution composed of hydrofluoric acid, nitric acid, and water.

Although the above-described embodiments are focused on semiconductor silicon wafers, the present invention is not limited thereto and can be applied to wafers of other semiconductor material such as a compound semiconductor (e.g., Ge, GaAs, Gap, InP).

What is claimed is:

1. A method of processing a semiconductor wafer sliced from a moncrystalline ingot, said method comprising at least the steps of chamfering, lapping, etching, mirror-polishing, and cleaning, wherein in said etching step alkali etching is first performed and then acid etching is performed; and an etching amount of the alkali etching is greater than an etching amount of the acid etching and the etching amount of the acid etching is 5–20 $\mu$m.

2. A method of processing a semiconductor wafer according to claim 1, wherein a wafer that has undergone the alkali etching is immersed into aqueous solution of hydrogen peroxide before being subjected to the acid etching.

3. A method of processing a semiconductor wafer according to claim 1, wherein the etching amount of the alkali etching is 10–30 $\mu$m, and the etching amount of the acid etching is 5–20 $\mu$m.

4. A method of processing a semiconductor wafer according to claim 1, wherein an etchant used in said alkali etching is an aqueous solution of NaOH or KOH, and an etchant used in said acid etching is a mixed acid aqueous solution composed of hydrofluoric acid, nitric acid, acetic acid, and water.

5. A method of processing a semiconductor wafer according to claim 3, wherein an etchant used in said alkali etching is an aqueous solution of NaOH or KOH, and an etchant used in said acid etching is a mixed acid aqueous solution composed of hydrofluoric acid, nitric acid, acetic acid, and water.

6. A method of processing a semiconductor wafer according to claim 1, wherein said acid etching is reaction-controlled acid etching.

7. A method of processing a semiconductor wafer according to claim 3, wherein said acid etching is reaction-controlled acid etching.

8. A method of processing a semiconductor wafer according to claim 4, wherein said acid etching is reaction-controlled acid etching.

9. A method of processing a semiconductor wafer according to claim 6, wherein in the reaction-controlled acid etching, there is used an etchant obtained through addition of 20–30 g/l of silicon into a mixed acid aqueous solution composed of hydrofluoric acid, nitric acid, acetic acid, and water.

10. A method of processing a semiconductor wafer according to claim 7, wherein in the reaction-controlled acid etching, there is used an etchant obtained through addition of 20–30 g/l of silicon into a mixed acid aqueous solution composed of hydrofluoric acid, nitric acid, acetic acid, and water.

11. A method of processing a semiconductor wafer according to claim 8, wherein in the reaction-controlled acid etching, there is used an etchant obtained through addition of 20–30 g/l of silicon into a mixed acid aqueous solution composed of hydrofluoric acid, nitric acid, acetic acid, and water.

* * * * *